US010690723B2

(12) United States Patent
Bose et al.

(10) Patent No.: US 10,690,723 B2
(45) Date of Patent: *Jun. 23, 2020

(54) DETERMINATION AND CORRECTION OF PHYSICAL CIRCUIT EVENT RELATED ERRORS OF A HARDWARE DESIGN

(71) Applicant: International Business Machines Corporation, Armonk, NY (US)

(72) Inventors: Pradip Bose, Yorktown Heights, NY (US); Alper Buyuktosunoglu, White Plains, NY (US); Schuyler Eldridge, Ossining, NY (US); Karthik V. Swaminathan, Mount Kisco, NY (US); Yazhou Zu, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/398,972

(22) Filed: Apr. 30, 2019

(65) Prior Publication Data

US 2020/0158782 A1    May 21, 2020

Related U.S. Application Data

(63) Continuation of application No. 15/787,473, filed on Oct. 18, 2017, now Pat. No. 10,365,327.

(51) Int. Cl.
*G01R 31/3183* (2006.01)
*G06F 30/00* (2020.01)
*G01R 31/317* (2006.01)

(52) U.S. Cl.
CPC ........... *G01R 31/318357* (2013.01); *G01R 31/31704* (2013.01); *G06F 30/00* (2020.01)

(58) Field of Classification Search
CPC ............ G01R 31/318357; G01R 31/31704
(Continued)

(56) References Cited

U.S. PATENT DOCUMENTS 4,875,209 A    10/1989  Mathewes, Jr. et al.
5,831,996 A    11/1998  Abramovici et al.
(Continued)

OTHER PUBLICATIONS

Notice of Allowance received for U.S. Appl. No. 15/787,473 dated Mar. 15, 2019, 22 pages.
(Continued)

*Primary Examiner* — Suresh Memula
(74) *Attorney, Agent, or Firm* — Amin, Turocy & Watson, LLP

(57) ABSTRACT

Techniques facilitating determination and correction of physical circuit event related errors of a hardware design are provided. A system can comprise a memory that stores computer executable components and a processor that executes computer executable components stored in the memory. The computer executable components can comprise a simulation component that injects a fault into a latch and a combination of logic of an emulated hardware design. The fault can be a biased fault injection that can mimic an error caused by a physical circuit event error vulnerability. The computer executable components can also comprise an observation component that determines one or more paths of the emulated hardware design that are vulnerable to physical circuit event related errors based on the biased fault injection.

20 Claims, 11 Drawing Sheets

(58) Field of Classification Search
USPC .......................................................... 716/106
See application file for complete search history.

(56) References Cited

U.S. PATENT DOCUMENTS

| | | | |
|---|---|---|---|
| 5,896,401 | A | 4/1999 | Abramovici et al. |
| 6,636,995 | B1 | 10/2003 | Dean et al. |
| 7,120,559 | B1* | 10/2006 | Williams .............. G06F 11/079 702/185 |
| 7,576,557 | B1 | 8/2009 | Tseng et al. |
| 8,296,739 | B2 | 10/2012 | Kalla et al. |
| 8,458,650 | B2 | 6/2013 | Andrade et al. |
| 8,650,447 | B1 | 2/2014 | Wortman et al. |
| 9,170,904 | B1 | 10/2015 | LeCrone et al. |
| 9,389,977 | B2 | 7/2016 | Jang et al. |
| 2002/0073369 | A1 | 6/2002 | How et al. |
| 2005/0015691 | A1* | 1/2005 | Nozuyama .............. G11C 29/40 714/724 |
| 2007/0050740 | A1* | 3/2007 | Jacobi ................... G06F 17/504 716/103 |
| 2007/0162798 | A1* | 7/2007 | Das ..................... G06F 11/0721 714/724 |
| 2008/0215925 | A1 | 9/2008 | Degenaro et al. |
| 2009/0249301 | A1 | 10/2009 | Kalla et al. |
| 2012/0159276 | A1* | 6/2012 | Zandian ............. G01R 31/3016 714/734 |
| 2013/0300463 | A1* | 11/2013 | Gemmeke ............... G06F 1/324 327/113 |
| 2013/0305199 | A1 | 11/2013 | He et al. |
| 2014/0201599 | A1 | 7/2014 | Kark et al. |
| 2015/0212923 | A1 | 7/2015 | Sugiyama et al. |
| 2015/0226801 | A1* | 8/2015 | Hopkins .......... G01R 31/31705 714/731 |
| 2015/0326210 | A1* | 11/2015 | Beerel .................... H03K 3/037 326/94 |
| 2016/0110492 | A1* | 4/2016 | Huang ................ G06F 17/5081 716/113 |
| 2016/0125110 | A1* | 5/2016 | Mariani .............. G06F 17/5036 703/14 |
| 2016/0179577 | A1* | 6/2016 | Catthoor ................ G06Q 10/04 718/104 |
| 2016/0204781 | A1* | 7/2016 | Plusquellic ...... H03K 19/00323 326/8 |
| 2017/0184664 | A1* | 6/2017 | Nicolaidis .......... G01R 31/3172 |
| 2018/0175889 | A1* | 6/2018 | Bazarsky .......... H03M 13/3723 |
| 2018/0203963 | A1 | 7/2018 | Eghbal et al. |
| 2018/0349521 | A1 | 12/2018 | Jana et al. |

OTHER PUBLICATIONS

Balasubramanian et al., "Understanding the Impact of Gate-Level Physical Reliability Effects on Whole Program Execution", IEEE 20th International Symposium on High Performance Computer Architecture (HPCA), IEEE, 2014, 12 pages.

Hari et al., "SASSIFI: Evaluating Resilience of GPU Applications", Proceedings of the Workshop on Silicon Errors in Logic-System Effects (SELSE), 2015, 6 pages.

Mansour et al., "An Automated SEU Fault-Injection Method and Tool for HDL-Based Designs", IEEE Transactions on Nuclear Science, vol. 60, No. 4, Aug. 2013, pp. 2728-2733.

Cheng et al., "CLEAR: Cross-Layer Exploration for Architecting Resilience Combining Hardware and Software Techniques to Tolerate Soli Errors in Processor Cores", 53rd Annual Design Automation Conference (DAC), ACM, Jun. 2016, 6 pages.

List of IBM Patents or Applications Treated as Related.

* cited by examiner

DETERMINATION AND CORRECTION OF PHYSICAL CIRCUIT EVENT RELATED ERRORS OF A HARDWARE DESIGN

STATEMENT REGARDING FEDERALLY SPONSORED RESEARCH OR DEVELOPMENT

This invention was made with government support under HR0011-13-C-0022 awarded by Defense Advanced Research Projects Agency (DARPA). The government has certain rights to this invention.

BACKGROUND

The subject disclosure relates to computer architecture, and more specifically to determination and correction of physical circuit event related errors of a hardware design.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses, and/or computer program products that facilitate determination and correction of physical circuit event related errors of a hardware design.

According to an embodiment, a system can comprise a memory that stores computer executable components and a processor that executes the computer executable components stored in the memory. The computer executable components can comprise a simulation component that injects a fault into a latch and a combination of logic of an emulated hardware design. The fault can be a determinationbiased fault injection that can mimic an error caused by a physical circuit event error vulnerability. The computer executable components can also comprise an observation component that can determine one or more paths of the emulated hardware design that are vulnerable to physical circuit event related errors based on the biased fault injection.

According to another embodiment, a computer-implemented method can comprise injecting, by a system operatively coupled to a processor, a fault into a latch and a combination of logic of an emulated hardware design. The fault can be a biased fault injection that mimics an error caused by a physical circuit event error vulnerability. The computer-implemented method can also comprise determining, by the system, one or more paths of the emulated hardware design that are vulnerable to physical circuit event related errors based on the biased fault injection.

According to a further embodiment, a computer program product that facilitates determination and correction of physical circuit event related errors of a hardware design is provided. The computer program product can comprise a computer readable storage medium having program instructions embodied therewith, the program instructions executable by a processing component to cause the processing component to inject a fault into a latch and a combination of logic of an emulated hardware design. The fault can be a biased fault injection that mimics an error caused by a physical circuit event error vulnerability. The program instructions can also cause the processing component to determine one or more paths of the emulated hardware design that are vulnerable to the physical circuit event related errors based on the biased fault injection.

DETAILED DESCRIPTION

Figure 1:
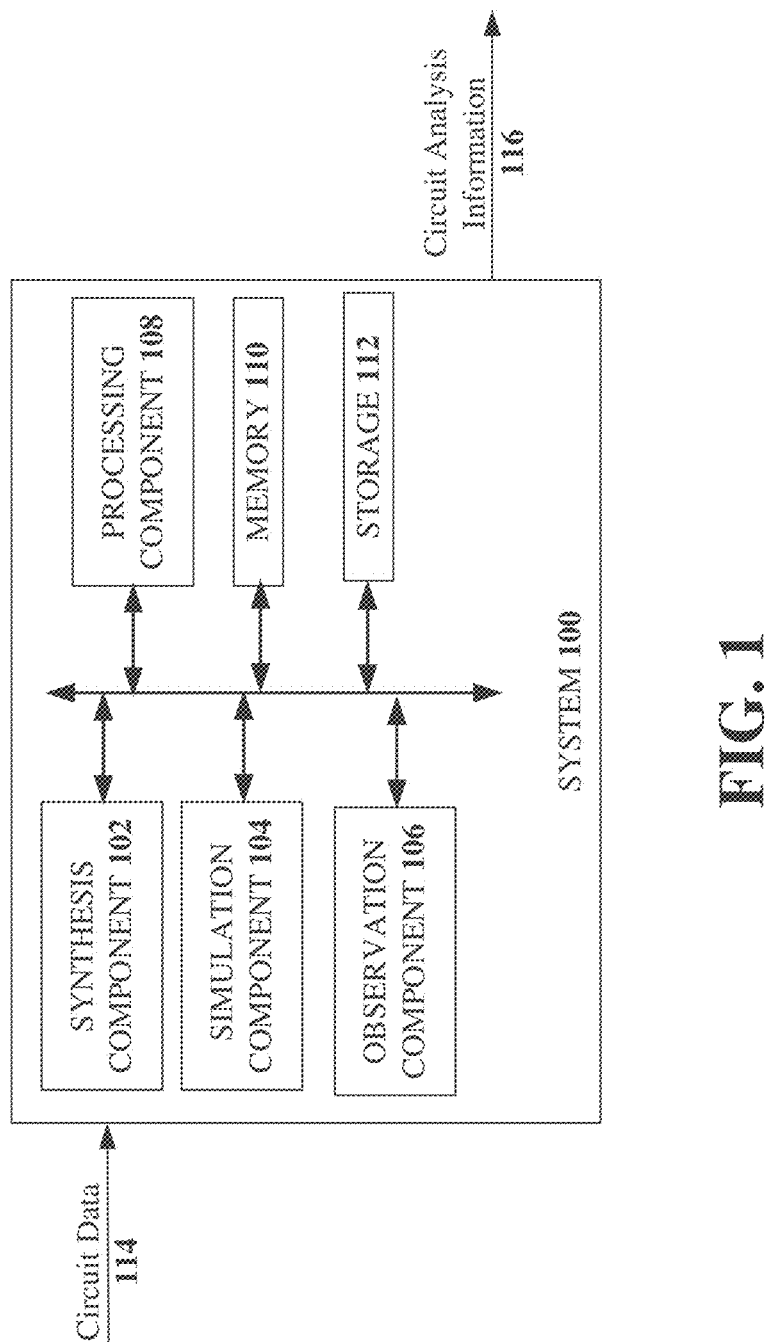
FIG. 1 illustrates a block diagram of an example, non-limiting system that facilitates determination of physical circuit event related errors of a hardware design in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Embodiments described herein comprise systems, computer-implemented methods, and computer program products that can determine and correct physical circuit event related errors of a hardware design. Specifically, one or more of the various aspects can be utilized as a pre-synthesis aid that can determine hardware elements that can be vulnerable to errors based on a biased fault injection that can mimic errors caused by physical circuit event error vulnerability. Examples of physical circuit event error vulnerability include, but are not limited to, a timing margin error, an under-voltage condition, temperature, and age of the circuit elements. Accordingly, the various aspects can model an underlying physical circuit event via fault injection. This can manifest as loss of timing margin for some, but not all, physical circuit events. The physical circuit events can be determined based on a function that translates a physical circuit event into one or more faults injected into at least a portion of the circuit.

The various aspects can enable the re-syntheses of a register transfer level (RTL) with additional timing margins (or hardened latches) in place of these hardware elements. In a digital circuit design, RTL is a design abstraction that can model a digital circuit in terms of the flow of data (e.g., digital signals) between hardware registers and logical operations performed on the data (e.g., digital signals).

Further, the various aspects discussed herein can be utilized to focus on the Field-Programmable Gate Array (FPGA) and Application-Specific Integrated Circuit (ASIC) space. For example, the disclosed aspects can include the ability to inject faults into the Hardware Description Language (HDL) with a view to mitigate physical circuit event errors by optimizing synthesis flow.

In addition, the various aspects discussed herein can be capable of fault injection for improving Soft Error Rate (SER) resilience in existing systems (e.g., post synthesis). Additionally, or alternatively, the various aspects can be utilized for pre-synthesis enhancements and can selectively target timing-critical hardware elements (e.g., hardware components).

As another example, the various aspects can evaluate the resilience of a processor through a simulated environment and can provide techniques for error mitigation. For example, the various aspects can utilize a feedback loop that can feed back the timing error information obtained from biased fault injection into the synthesis flow to selectively optimize vulnerable hardware elements.

FIG. 1 illustrates a block diagram of an example, non-limiting system 100 that facilitates determination of physical circuit event related errors of a hardware design in accordance with one or more embodiments described herein. Aspects of systems (e.g., the system 100 and the like), apparatuses, or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described herein.

In various embodiments, the system 100 can be any type of component, machine, device, facility, apparatus, and/or instrument that comprises a processor and/or can be capable of effective and/or operative communication with a wired and/or wireless network. Components, machines, apparatuses, devices, facilities, and/or instrumentalities that can comprise the system 100 can include tablet computing devices, handheld devices, server class computing machines and/or databases, laptop computers, notebook computers, desktop computers, cell phones, smart phones, consumer appliances and/or instrumentation, industrial and/or commercial devices, hand-held devices, digital assistants, multimedia Internet enabled phones, multimedia players, and the like.

The system 100 can employ hardware and/or software to solve problems that are highly technical in nature, that are not abstract and that cannot be performed as a set of mental acts by a human. Further, in certain embodiments, some of the processes performed can be performed by one or more specialized computers (e.g., one or more specialized processing units, a specialized computer with a fault injection computing component, etc.) to carry out defined tasks related to determination and correction of physical circuit event related errors of a hardware design.

The system 100 and/or components of the system 100 can be employed to solve new problems that arise through advancements in technologies mentioned above, computer architecture, and/or the like. One or more embodiments of the system 100 can provide technical improvements to circuit designs, computing systems, circuit systems, processor systems, artificial intelligence systems, and/or other systems. One or more embodiments of the system 100 can also provide technical improvements to a computing system by improving processing performance of the processor, improving processing efficiency of the processor, improving processing characteristics of the processor, improving timing characteristics of the processor, and/or improving power efficiency of the processor.

In the embodiment shown in FIG. 1, the system 100 can comprise a synthesis component 102, a simulation component 104, an observation component 106, a processing component 108, a memory 110, and/or a storage 112. The memory 110 can store computer executable components and instructions. The processing component 108 (e.g., a processor) can facilitate execution of the instructions (e.g., computer executable components and corresponding instructions) by the synthesis component 102, the simulation component 104, the observation component 106, and/or other system components. As shown, one or more of the synthesis component 102, the simulation component 104, the observation component 106, the processing component 108, the memory 110, and/or the storage 112 can be electrically, communicatively and/or operatively coupled to one another to perform one or more functions of the system 100.

The synthesis component 102 can receive, as input data, circuit data 114 of a circuit under observation (e.g., a target circuit). For example, the circuit data 114 can be a machine-readable description of the target circuit. The target circuit can be a circuit related to a central processing unit (CPU) and accelerator design, for example.

In another example, the input data or circuit data 114 can include a hardware description or circuit description. For example, parallel simulation can include Verilog and/or VHDL (Very High Speed Integrated Circuit Hardware Description Language). It is also noted that emerging hardware platforms can rely on accelerators to improve system performance and reduce power. Thus, it can be beneficial to develop hardware accelerators in high level languages (e.g., describing algorithms) such as SystemC/System Verilog/Bluespec, or another high-level synthesis (HLS). Further to describe circuits, Scala/chisel and/or other domain specific languages for circuit description can be utilized. Further, the various aspects can subsequently synthesize the hardware accelerators to FPGA or application-specific integrated circuit (ASIC) using Verilog/VHDL, for example.

A tool to study the resiliency of such hardware platforms under physical circuit events has not existed prior to the aspects disclosed herein. As an example, stringent timing margins, such as those in under-voltage environments, can reduce a redundant voltage guardband level and can improve system power efficiency. Side-effects of stringent timing margins can include reduced system reliability. For example, it can be that the hardware did not execute correctly because of potentially insufficient guardband to protect against uncertain load environments.

The disclosed aspects can emulate the fault scenarios of a hardware design under a stringent timing margin on FPGA by injecting bit-flip faults into hardware latches in a timing-margin-aware manner. For example, when a failure occurs, such as in the case of voltage noise, multiple bit-flips can occur. Thus, multiple bits can flip from respective original values to different values. When the flips occur, the circuit can be in a state where the change to the original values can affect the correctness of the application being executed by the circuit.

With the disclosed aspects, developers of accelerator rich hardware can emulate the hardware resiliency and application fault-tolerance under potentially stringent timing margins on FPGAs. The fault injection information provided by the disclosed aspects, coupled with application execution logs, can provide a good guidance for the design of resilient low-voltage hardware by identifying vulnerable hardware modules. The various aspects can also enable the design of fault-tolerant applications that are less susceptible to potential errors stemming from stringent timing margins.

In one or more embodiments, the synthesis component 102 can emulate a hardware design. For example, the synthesis component 102 can receive as the circuit data 114 information related to a hardware design under consideration (e.g., a hardware design that is to be tested as discussed herein (the target circuit)). For example, the circuit data 114 can include details related to one or more latches and/or combination of logic that can be included in the hardware design. According to some implementations, the hardware design can include hundreds (or even thousands) of latches and/or logic combinations. Further, the hardware design can include multiple flow paths. Different flow paths of the multiple flow paths can include one or more of the latches and/or one or more of the combinations of logic.

The simulation component 104 can inject a fault (or multiple faults) into a latch and a combination of logic of the emulated hardware design. A fault can be a biased fault injection that can mimic an error caused by a physical circuit event error vulnerability. According to some implementations, the simulation component 104 can selectively inject the fault(s) into a timing-critical element of the emulated hardware design.

Selectively injecting the faults can include static and/or dynamic techniques. For example, for the static techniques, selectively injecting the faults can include flipping bits in the RTL at compile time. For the dynamic techniques, selectively injecting the faults can include fault injection by means of scanning in a bitstream at runtime, wherein the bitstream indicates which latches should be flipped. In some implementations, the static techniques can include additional compilation cycles, while the dynamic techniques do not include additional cycles. The static technique can be implemented as a direct modification of RTL/recompiling. The dynamic techniques can be injection of faults based on a bit vector passed at runtime.

Upon or after the injection of the fault, the observation component 106 can determine one or more paths of the emulated hardware design that can be vulnerable to physical circuit event related errors. For example, the determination by the observation component 106 can be made based on the biased fault injection. The observation component 106 can output the information related to the one or more paths as output data or circuit analysis information 116. According to some implementations, the circuit analysis information 116 can be fed back to the synthesis component 102 as circuit data 114, which will be discussed in further detail with respect to FIG. 3.

In certain embodiments, the simulation component 104 can inject the fault (or the multiple faults) into a latch and a combination of logic of the emulated hardware design based on classifications, correlations, inferences and/or expressions associated with principles of artificial intelligence. For instance, the simulation component 104, as well as other system components, can employ an automatic classification system and/or an automatic classification process to determine which faults to apply and to which paths to apply those faults. In one example, the simulation component 104 can employ a probabilistic and/or statistical-based analysis (e.g., factoring into the analysis utilities and costs) to learn and/or generate inferences with respect to the one or more paths and corresponding faults that should be applied to the one or more paths. In an aspect, the simulation component 104 can comprise an inference component (not shown) that can further enhance automated aspects of the simulation component 104 utilizing in part inference based procedures to facilitate learning and/or generating inferences associated with the faults that should be applied to achieve information related to how a path, or multiple paths, respond to the faults. The simulation component 104 can employ any suitable machine-learning based techniques, statistical-based techniques and/or probabilistic-based techniques. For example, the simulation component 104 can employ expert systems, fuzzy logic, SVMs, Hidden Markov Models (HMMs), greedy search algorithms, rule-based systems, Bayesian models (e.g., Bayesian networks), neural networks, other non-linear training techniques, data fusion, utility-based analytical systems, systems employing Bayesian models, etc. In another aspect, the simulation component 104 can perform a set of machine learning computations associated with generation of fault signals. For example, the simulation component 104 can perform a set of clustering machine learning computations, a set of logistic regression machine learning computations, a set of decision tree machine learning computations, a set of random forest machine learning computations, a set of regression tree machine learning computations, a set of least square machine learning computations, a set of instance-based machine learning computations, a set of regression machine learning computations, a set of support vector regression machine learning computations, a set of k-means machine learning computations, a set of spectral clustering machine learning computations, a set of rule learning machine learning computations, a set of Bayesian machine learning computations, a set of deep Boltzmann machine computations, a set of deep belief network computations, and/or a set of different machine learning computations to determine the circuit analysis information 116.

It is to be appreciated that the system 100 (e.g., the synthesis component 102, the simulation component 104, and/or the observation component 106, as well as other system components) performs a circuit analysis and/or generates one or more fault signals that cannot be performed by a human (e.g., is greater than the capability of a single human mind). For example, an amount of data processed, a speed of data processed and/or data types of data processed by the system 100 (e.g., the synthesis component 102, the simulation component 104, and/or the observation component 106) over a certain period of time can be greater, faster, and different than an amount, speed, and data type that can be processed by a single human mind over the same period of time. The system 100 (e.g., the synthesis component 102, the simulation component 104, and/or the observation component 106) can also be fully operational towards performing one or more other functions (e.g., fully powered on, fully executed, etc.) while also performing the above-referenced target circuit analysis and/or fault signal generation process. Moreover, fault signals generated and coordinated by the system 100 (e.g., the synthesis component 102, the simulation component 104, and/or the observation component 106) can include information that is impossible to obtain manually by a user. For example, a type of information included in the circuit data 114, a variety of information associated with the circuit data 114, and/or optimization of the circuit data 114 to generate and output the circuit analysis information 116 can be more complex than information that can be obtained manually and processed by a user.

Figure 2:
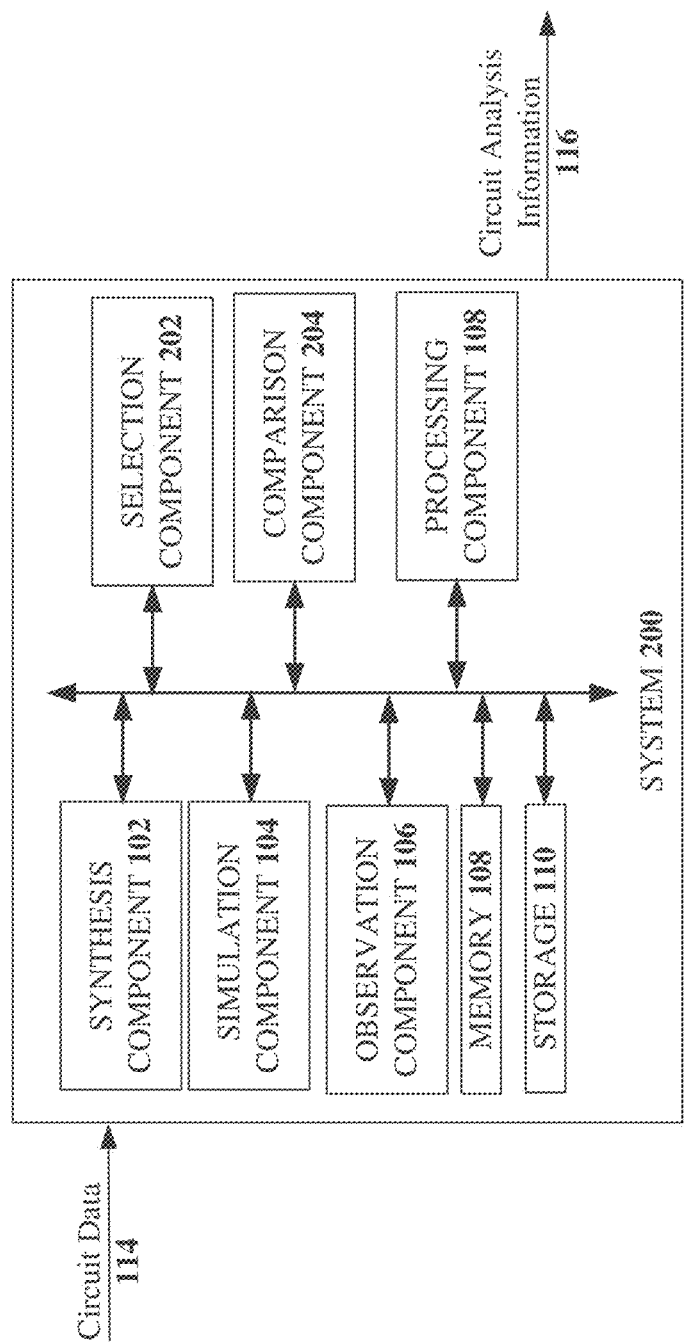
FIG. 2 illustrates a block diagram of an example, non-limiting system that determines and corrects physical circuit event related errors of a hardware design in accordance with one or more embodiments described herein.

FIG. 2 illustrates a block diagram of an example, non-limiting system 200 that determines and corrects physical circuit event related errors of a hardware design in accordance with one or more embodiments described herein. Repetitive description of like elements employed in other embodiments described herein is omitted for sake of brevity.

The system 200 can comprise one or more of the components and/or functionality of the system 100, and vice versa. The various aspects discussed herein can be utilized to facilitate a hardware design that can be resilient to bit flip error patterns. Therefore, a voltage guardband value can be reduced, or eliminated, resulting in power savings and other advantages. It is noted that operation at nominal voltage can be performed with the understanding that the paths meet timing parameters. For example, the timing parameters can be that the path delay (Tpath) should be less than the maximum possible delay allowable (Tcrit) for all paths, or Tpath<Tcrit for all paths. Further, as discussed herein, fault injection can be utilized to mimic bit errors that might occur when voltage is reduced, without having to reduce the voltage.

A voltage guardband is a redundant mechanism to protect processor reliability from uncertain operating environments (e.g., heating, aging). For example, an additional voltage value (e.g., the voltage guardband) can be added to the operating voltage of the circuit to compensate in the case of a failure. However, in a large percentage of the cases, the voltage guardband is not necessary. It has been observed that safely undervolting (e.g., reducing or mitigating the value of the voltage guardband) can save power. In some cases, the power savings was observed to be fifteen percent or more.

In various implementations, the simulation component 104 can inject the fault into the one or more paths. For example, the simulation component 104 can selectively inject the fault into a timing-critical element of the emulated hardware design. According to some implementations, the simulation component 104 can inject the fault into the one or more paths and the observation component 106 can determine respective criticalities of the one or more paths based on a defined threshold. The fault can comprise a bit flip error. In accordance with an implementation, the simulation component 104 can embed combination logic that selects between authentic latch data and faulty latch data.

Further to these implementations, the simulation component 104 can determine respective criticalities of the one or more paths based on a defined threshold. For example, the fault can comprise a bit flip error. Although undervolting can save power, there is no longer a correctness guarantee that is available with utilization of the voltage guardband. It is noted that without (or with a minimal value of) a voltage guardband, a timing margin is no longer available. Thus, a latter latch does not have enough time to store correct bit values. In other word, there is a bit flip error (e.g., latch value 0→1, or 1→0).

As it relates to chip undervolting resiliency, the following is an example of a possible undervolting bit flip error pattern. For example, there can be dense errors in many latches located in a particular area of a circuit. In addition, there can be multi-bit flips (as opposed to single/double bit flip in soft errors). The causes for this can include local/global di/dt effect and temperature hotspots, to name a few. The various aspects discussed herein can be utilized to determine a hardware design or system that can be resilient to this type of error.

The system 200 can comprise a selection component 202 that can randomly change bits inside a latch, for example. The changes to the bits can mimic the error caused by the physical circuit event error vulnerability. According to some implementations, the simulation component 104 can embed combination logic that selects between authentic latch data and faulty latch data. In accordance with some implementations, the selection component 202 can select a module of the module hierarchy and a latch of the latch information.

According to some implementations, the system 200 can comprise a comparison component 204 that can evaluate a difference between a result of the fault injected into the latch against a determined acceptable result. For example, the observation component 106 can determine the one or more paths are vulnerable to the physical circuit event related errors based on a determination that the difference is above a defined difference level. The defined difference level can be the different between a path delay (Tpath) and a maximum possible delay allowable (Tcrit) for which there are no timing errors. If the difference (Delta(s)=Tcrit−Tpath) is below a defined threshold, the path can be classified as vulnerable. If the difference is below the defined difference level, a change to one or more elements of the one or more paths that exhibit the difference can be replace with a different type of element (e.g., hardware element). If the difference is determined to be at or above the defined difference level, the difference can be acceptable and, therefore, no changes are made.

Figure 3:
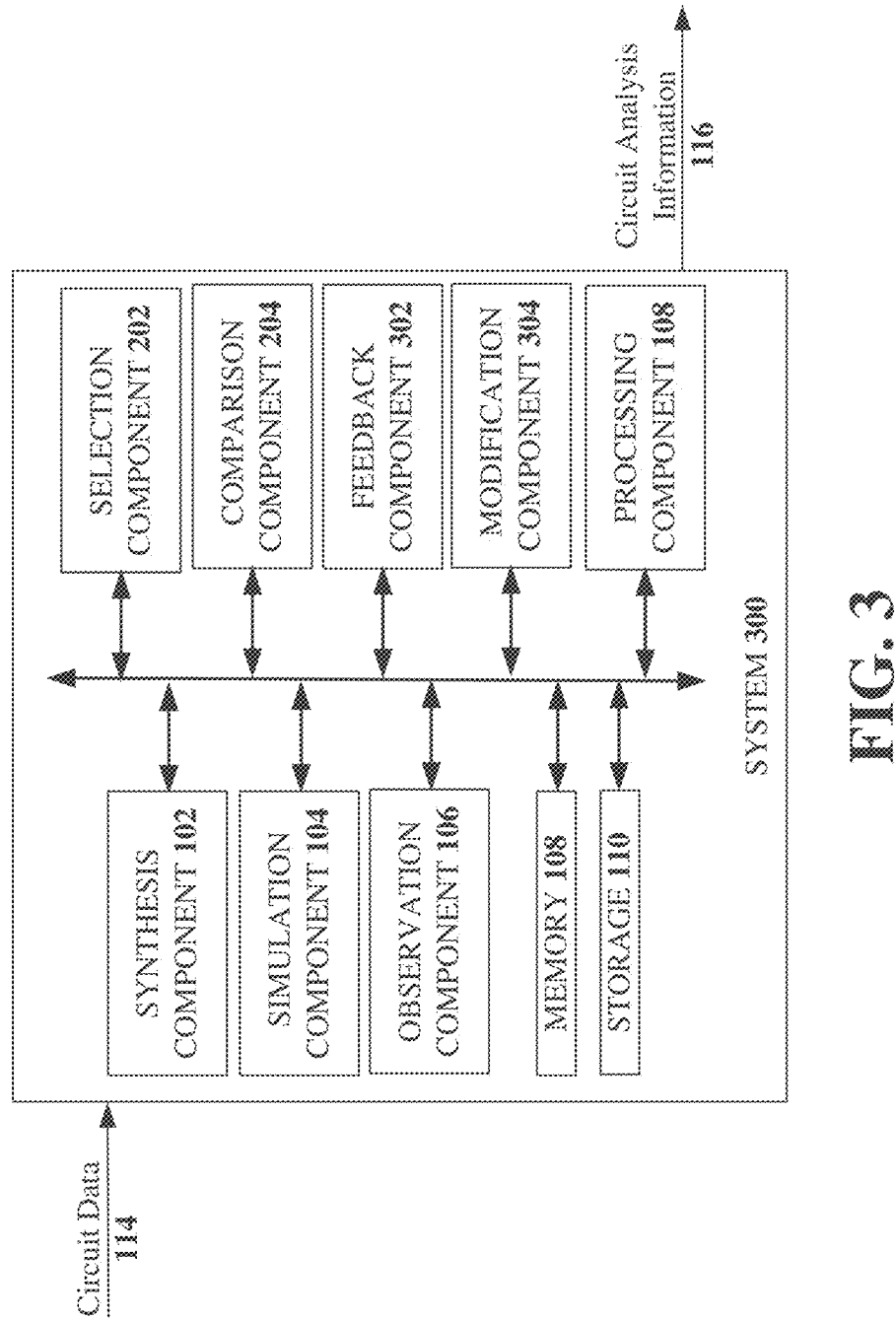
FIG. 3 illustrates a block diagram of an example, non-limiting system that comprises a feedback loop in accordance with one or more embodiments described herein.

FIG. 3 illustrates a block diagram of an example, non-limiting system 300 that comprises a feedback loop in accordance with one or more embodiments described herein. Repetitive description of like elements employed in other embodiments described herein is omitted for sake of brevity.

The system 300 can comprise one or more of the components and/or functionality of the system 100, the system 200, and vice versa. The system 300 can be utilized to develop an FPGA infrastructure that can emulate physical circuit event related errors of a CPU and accelerator design. For example, the system 300 can take a machine-generated HDL from high-level synthesis (e.g., circuit data 114), and accumulate all module hierarchy and latch information from the design. A set of modules, latches, and/or combinations of logic can be derived from the accumulated information. Bits inside the set of modules, latches, and/or combinations of logic can be randomly flipped (e.g., changed to a different value). The selection of the latch and modules can be determined in an arbitrary manner According to some implementations, the selection can be guided by path timing information. For example, the path timing information can be gathered after going through an ASIC design flow. Further, Electronic Design Automation (EDA) tools can infer respective delays of the one or more paths, taking into account the logic depth, device type, technology node, and so on. Paths with longer delays can be more susceptible to stringent physical circuit event when under volting, and the associated latches can receive more bit flip errors, according to an implementation.

The system 300 can inject faults into the latches by embedding a set of combinational logic that selects original authentic latch data, or faulty data with bit flips. A new hardware design with fault injection logic (determined based on the disclosed aspects) can be synthesized to FPGA to run applications. Applications can run on the fault injected hardware. Execution results can be compared with fault injection, versus correct results, and the system 300 can evaluate the physical circuit event error vulnerability of the injected latches. The hardware design can be modified or a re-synthesize design can be created with different timing constraints to enhance resiliency of the hardware circuit.

A feedback component 302 can return timing error information obtained from the biased fault injection into a synthesis flow that selectively targets vulnerable elements in the emulated hardware design. The timing error information can be output as circuit analysis information 116.

According to some implementations, a modification component 304 can selectively adjust a timing of the one or more paths. For example, the modification component 304 can selectively adjust the timing based on a determination that the one or more paths are vulnerable to the physical circuit event related errors. In an alternative or additional implementation, the modification component 304 can change a timing constraint of the emulated hardware design. The timing constraint can increase a resiliency of the emulated hardware design.

In some implementations, injecting faults into latches can include automatically embedding a set of combination logic that selects original authentic latch data, or faulty data, with bit flips. The original hardware design plus fault injection logic on selected latches can be utilized to form a new hardware design. The new hardware design can be synthesized to FPGA to run applications. The various aspects can perform the bit flip once during an application run, let the application run to completion, and record final information (e.g., hangs, crash, or silent data corruption). The time point to perform the bit flip can be determined randomly during an applications end-to-end runtime via a pre-run.

Advantages of the various aspects discussed herein include interpreting every latch in the hardware design instead of being limited to architecturally visible latches. Thus, the disclosed aspects can cover a wider range for fault injection. Further, the one or more aspects can be used with any hardware design and is not limited to a particular type of hardware implementation, such as those limited by processor instruction sets or microarchitecture. The one or more aspects can perform fault injection with flexible control over the target hardware latches. The hardware latches can be various latches, with numerous bit flips. The one or more target latches can have different probability of bit flipping depending on defined specifications. For example, a defined specification can be that a particular set of latches located in one module has a very high probability of multi-bit flip to mimic a localized di/dt event or chip heating occurring around that module. The fault injected hardware can be emulated on FPGA and can allow the application to run end-to-end at a speed faster than a software simulator. The information derived can provide a better understanding of the resiliency of the hardware design under a strict timing margin.

Figure 4:
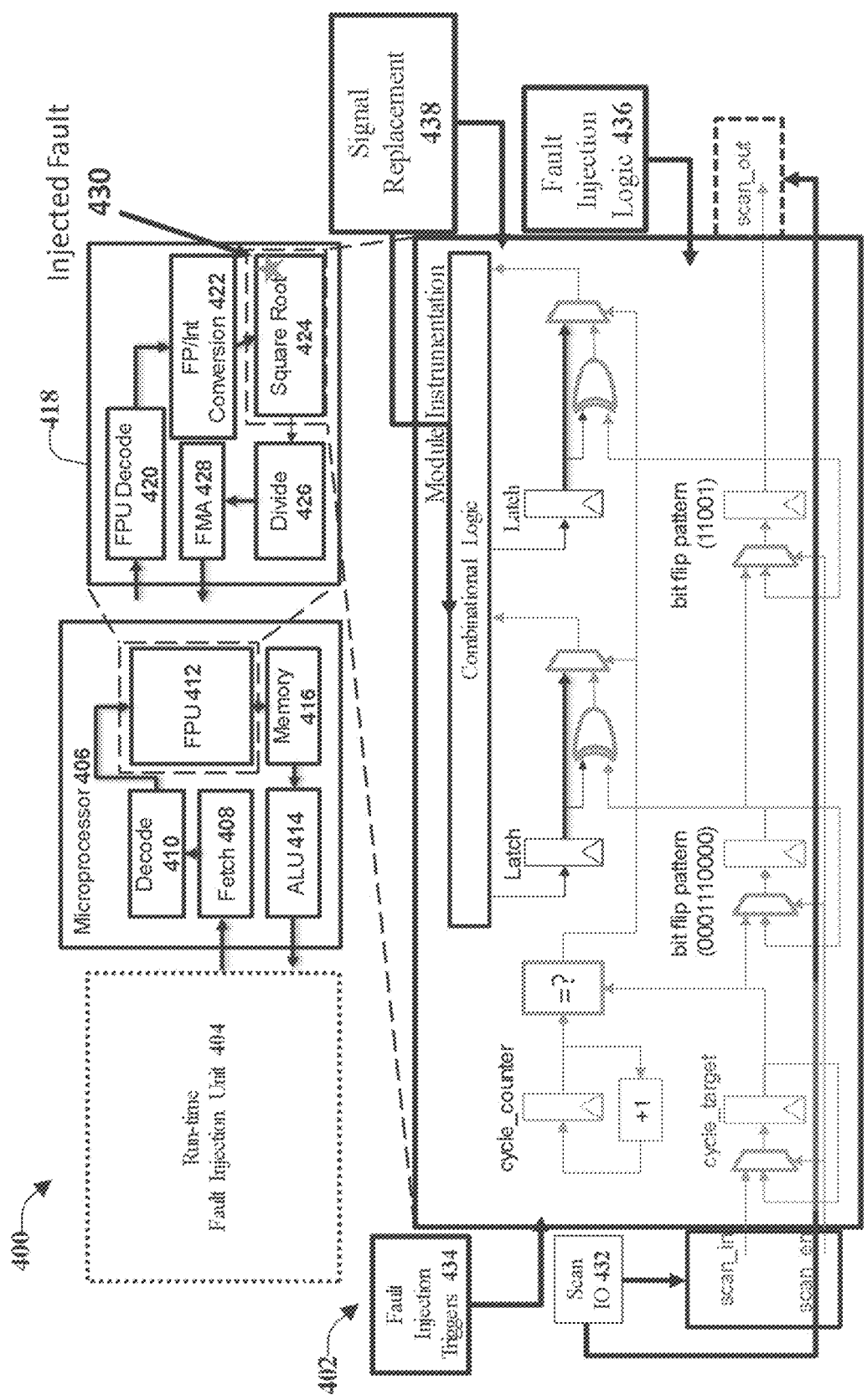
FIG. 4 illustrates an example, non-limiting representation of a module hierarchy instrumented with a fault injection scan chain and the internals of an instrumentation model in accordance with one or more embodiments described herein.

FIG. 4 illustrates an example, non-limiting representation of a module hierarchy 400 instrumented with a fault injection scan chain and the internals of an instrumentation model 402 in accordance with one or more embodiments described herein. The module hierarchy 400 is illustrated at the top of FIG. 4, and the internals of the instrumentation model 402 are illustrated at the bottom of FIG. 4.

The module hierarchy 400 illustrates that the system can be wired up via a scan chain to enable configuration of specific faults. The module hierarchy 400 can comprise one or more of the components and/or functionality of the system 100, the system 200, the system 300, and vice versa. The module hierarchy 400 can include a run-time fault injection unit 404, which can be software programmed. Further, the run-time fault injection unit 404 can be capable of triggering faults on events. Examples include, but are not limited to, cycle count, instruction, and function.

Also included in the module hierarchy 400 can be a microprocessor 406. Included in the microprocessor 406 can be a fetch component 408, a decode component 410, a Floating-Point Unit or FPU component 412, an Arithmetic Logic Unit or ALU component 414, and a memory 416. As illustrated in the expanded view 418, the FPU component 412 can include a FPU decoder 420, a floating point to integer converter 422, a square root unit 424, a divide unit 426, and a Fuse Multiply-Add (FMA) Unit 428. As illustrated a fault can be injected, as indicated at 430.

As illustrated by the internals of the instrumentation model 402, according to some implementations for a scan I/O 432, modifications to modules can be made for additional I/Os to be configured per-module fault injection triggers 434 and fault injection logic 436. As it relates to fault injection triggers 434, modules can be modified to inject faults at a specific time or with a specific frequency. For fault injection logic 436, modifications to module logic that allow specific fault patterns or frequencies to be injected when signaled by injection triggers can be performed. Replacement of references to original signals with fault-injected signals can be included (e.g., signal replacement 438). Further, for the run-time fault injection unit, the addition of a run-time fault injection unit for configuration can be made.

A description of the design hierarchy can be used to create a fault configuration for some desired fault parameters (e.g., specific locations to inject faults at specific times). In accordance with some implementations, a test program can read the fault configuration, can set up the run-time fault injection unit with the fault configuration, and can run a defined program with the desired faults.

Figure 5:
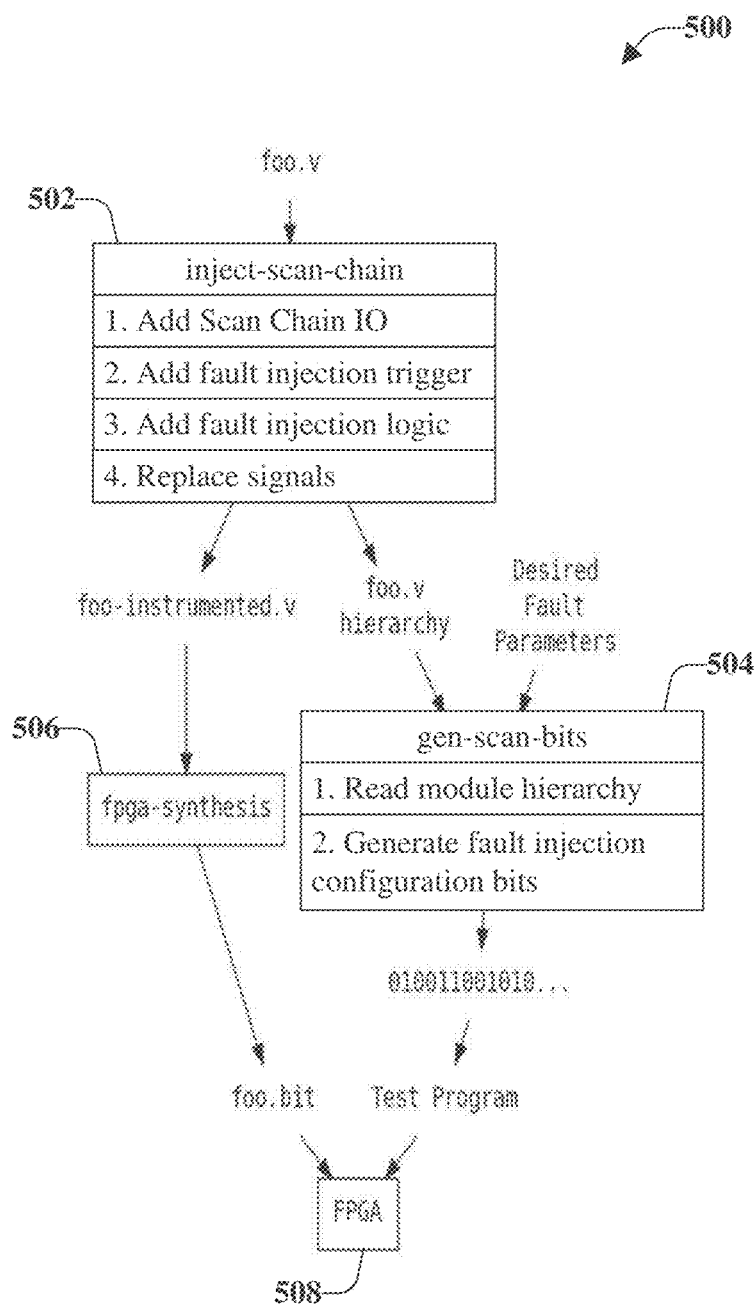
FIG. 5 illustrates an example, non-limiting, instrumentation and fault injection tool flow in accordance with one or more embodiments described herein.

FIG. 5 illustrates an example, non-limiting, instrumentation and fault injection tool flow 500 in accordance with one or more embodiments described herein. It is noted that although a particular tool flow and program language is shown, the disclosed aspects are not limited to this example. Instead, other tool flows and/or program languages can be utilized to implement the disclosed aspects.

As discussed herein, various aspects relate to a system that can instrument a hardware description of a circuit to add structures that support run-time variable fault injection (e.g., an inject-scan-chain 502 as illustrated in FIG. 5). In addition, the various aspects relate to a system that can generate a configuration to inject faults with desired parameters at run time (e.g., gen-scan-bits in 504 FIG. 5)

In accordance with an embodiment, the configuration to inject faults can be provided via a scan chain (e.g., the inject-scan-chain 502). Alternatively, the configuration can be communicated via any out-of-band network. As an example, the inject-scan-chain 502 can include an instruction to add scan chain IO, add a fault injection trigger, add fault injection logic, and to replace signals.

The output can be input into an FPGA synthesis 506 to modify the FPGA 508. In some implementations, the output can be utilized to inject the faults with desired parameters at run-time (e.g., gen-scan-bits 504). This implementation can include instructions to read the module hierarchy and generate one or more fault injection configuration bits.

Figure 6:
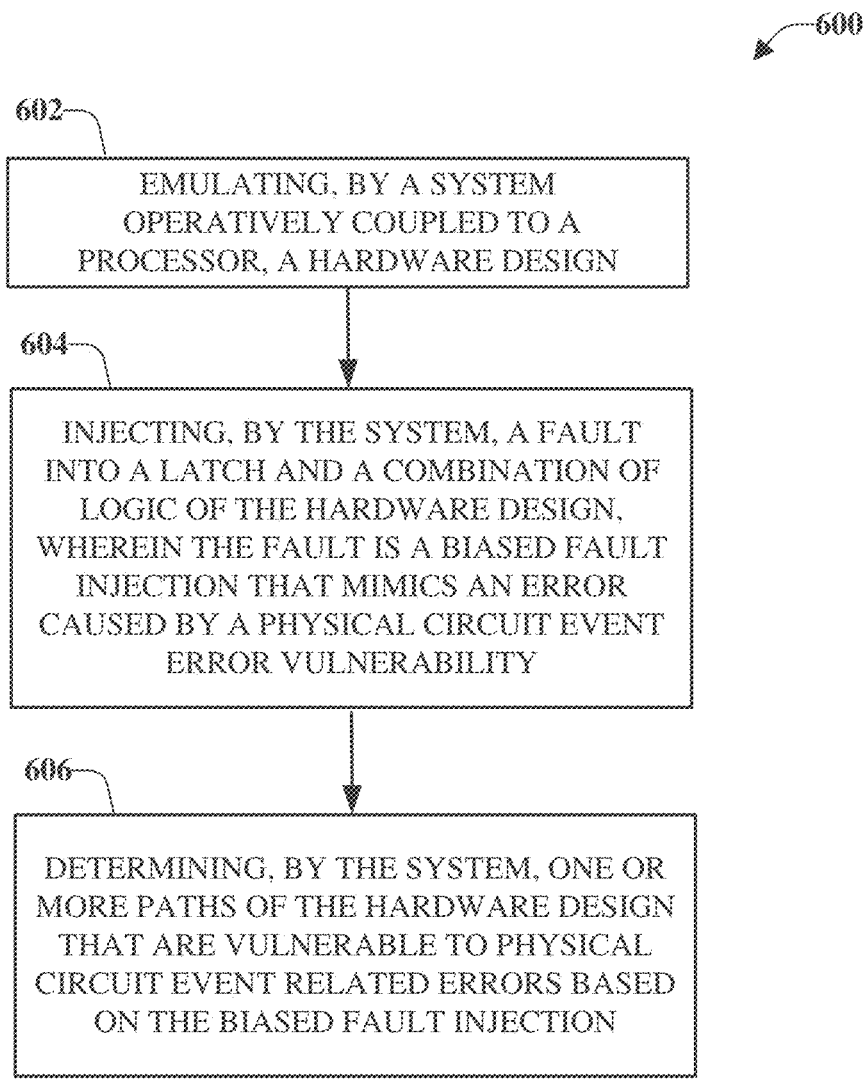
FIG. 6 illustrates a flow diagram of an example, non-limiting computer-implemented method that facilitates determination of physical circuit event related errors of a hardware design in accordance with one or more embodiments described herein.

FIG. 6 illustrates a flow diagram of an example, non-limiting computer-implemented method 600 that facilitates determination of physical circuit event related errors of a hardware design in accordance with one or more embodiments described herein. Repetitive description of like elements employed in other embodiments described herein is omitted for sake of brevity.

At 602 of the computer-implemented method 600, a system operatively coupled to one or more processors, can emulate a hardware design (e.g., via the synthesis component 102). For example, information related to an existing hardware design, or a hardware design being created can be received. The received information can include details related to identification of various hardware elements included in the design. This information can be utilized to emulate the hardware design.

A fault can be injected, by the system, into a latch and a combination of logic of the emulated hardware design, at 604 of the computer-implemented method 600 (e.g., via the simulation component 104). The fault can be a biased fault injection that mimics an error caused by a physical circuit event error vulnerability. For example, the system can selectively inject the fault into a timing-critical element of the emulated hardware design.

Further, at 606 of the computer-implemented method 600, the system can determine one or more paths of the emulated hardware design that are vulnerable to physical circuit event related errors based on the biased fault injection (e.g., via the observation component 106).

Figure 7:
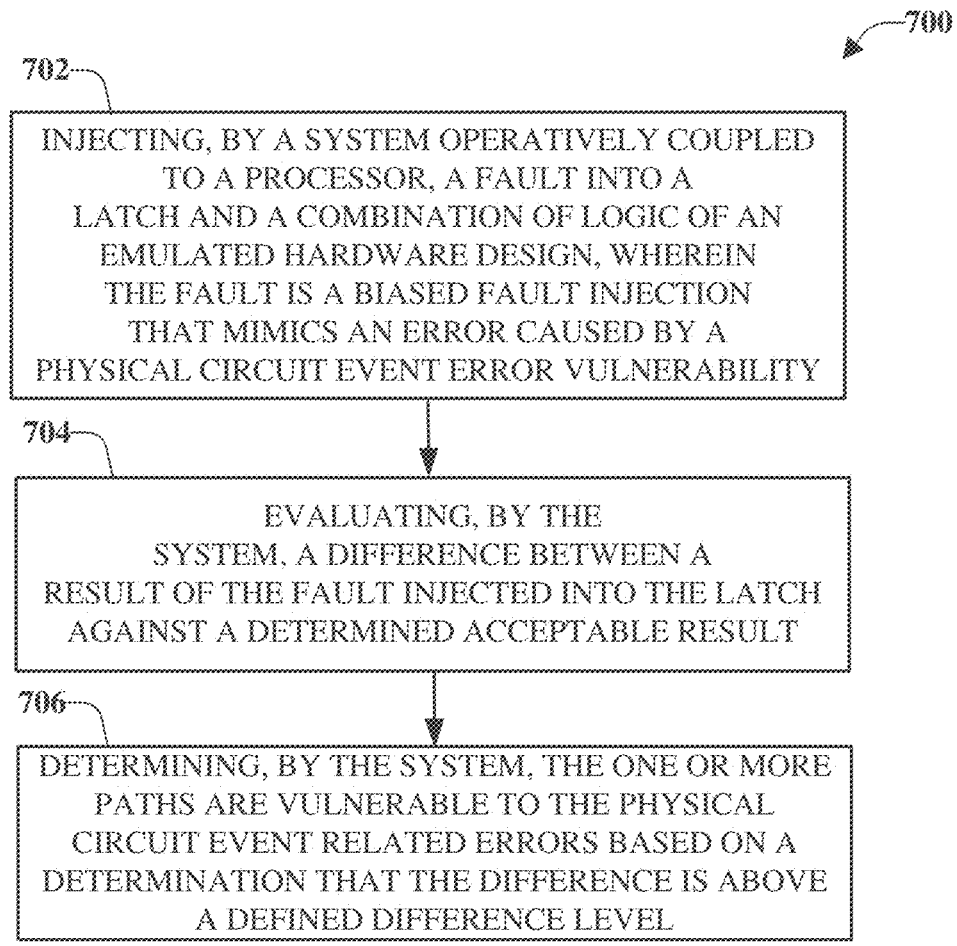
FIG. 7 illustrates a flow diagram of an example, non-limiting computer-implemented method that facilitates determination and correction of physical circuit event related errors of a hardware design in accordance with one or more embodiments described herein.

FIG. 7 illustrates a flow diagram of an example, non-limiting computer-implemented method 700 that facilitates determination and correction of physical circuit event related errors of a hardware design in accordance with one or more embodiments described herein. Repetitive description of like elements employed in other embodiments described herein is omitted for sake of brevity.

The computer-implemented method 700 starts, at 702, when a system operatively coupled to a processor injects a fault into a latch and a combination of logic of an emulated hardware design (e.g., via the simulation component 104). The fault can be a biased fault injection that mimics an error caused by a physical circuit event error vulnerability. According to some implementations, the computer-implemented method 700 can include selectively adjusting, by the system, a timing of the one or more paths based on a determination that the one or more paths are vulnerable to the physical circuit event related errors. In an alternative or additional implementation, the computer-implemented method 700 can include randomly changing, by the system, bits inside the latch, wherein the changes to the bits mimic the error caused by the physical circuit event error vulnerability.

At 704 of the computer-implemented method 700, the system can evaluate a difference between a result of the fault injected into the latch against a determined acceptable result (e.g., via the comparison component 204). Further, at 706 of the computer-implemented method, the system can determine the one or more paths are vulnerable to the physical circuit event related errors based on a determination that the difference is below a defined difference level (e.g., via the observation component 106). For example, a timing constraint of the emulated hardware design can be changed or a suggestion related to the change can be output for physical changes to be made to the hardware design. The timing constraint can increase a resiliency of the emulated hardware design.

In some implementations, injecting the fault can include, injecting, by the system, the fault into the one or more paths. Further to these implementations, the computer-implemented method 700 can include determining, by the system, respective criticalities of the one or more paths based on a defined threshold. In addition, the fault can comprise a bit flip error. According to some implementations, the computer-implemented method 700 can include embedding combination logic that selects between authentic latch data and faulty latch data.

Figure 8:
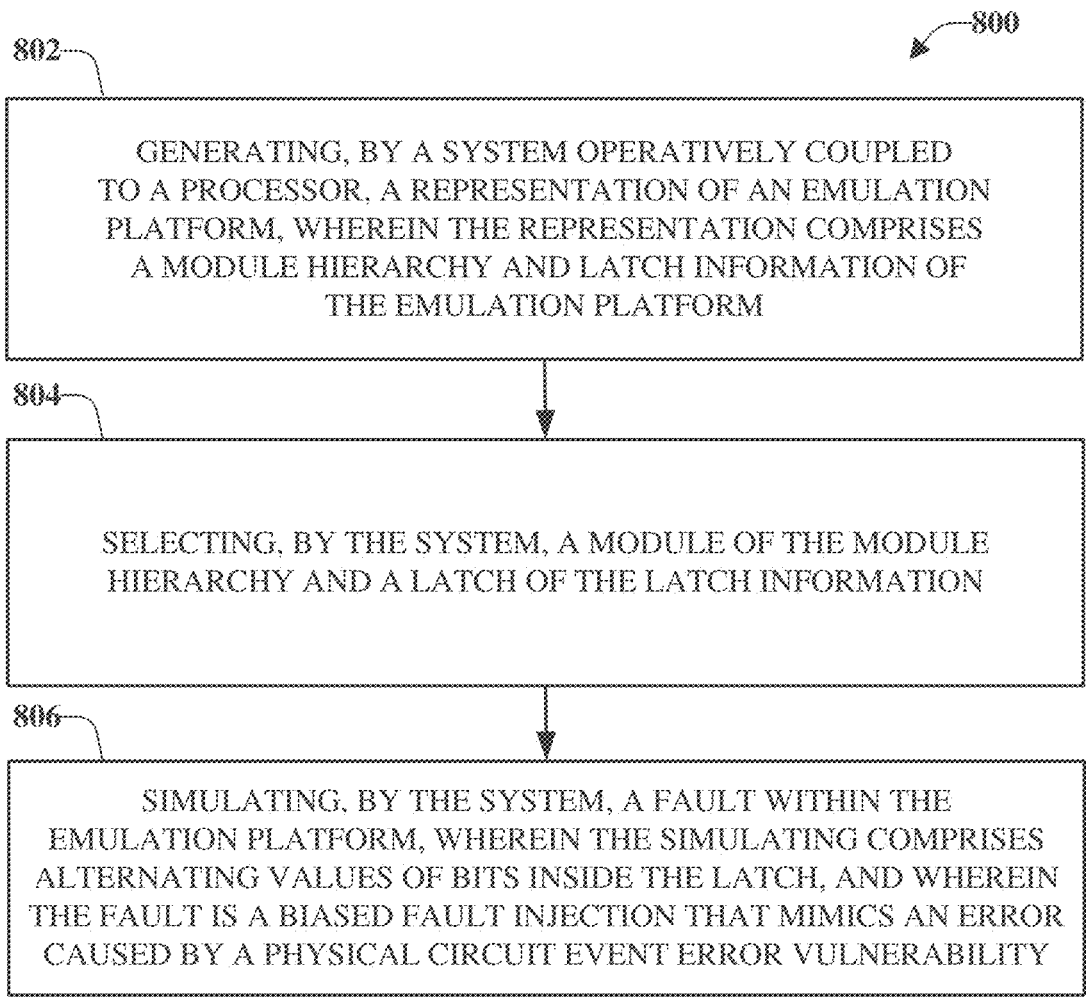
FIG. 8 illustrates a flow diagram of an example, non-limiting computer-implemented method that facilitates simulating a fault within an emulated platform in accordance with one or more embodiments described herein.

FIG. 8 illustrates a flow diagram of an example, non-limiting computer-implemented method 800 that facilitates simulating a fault within an emulated platform in accordance with one or more embodiments described herein. Repetitive description of like elements employed in other embodiments described herein is omitted for sake of brevity.

The computer-implemented method 800 can start, at 802, when a system operatively coupled to a processor generates a representation of an emulation platform (e.g., via the synthesis component 102). The representation can comprise a module hierarchy and latch information of the emulation platform. In an example, the emulation platform can be a field programmable gate array. In some implementations, the computer-implemented method 800 can include injecting, by the system, multiple faults into paths determined to be timing critical paths, wherein the multiple faults simulate bit flip errors.

At 804 of the computer-implemented method 800, the system can select a module of the module hierarchy and a latch of the latch information (e.g., via the selection component 202). Further, at 806, of the computer-implemented method 800, the system can simulate a fault within the emulation platform (e.g., via the simulation component 104). Simulating the fault can comprise alternating values of bits inside the latch. The fault can be a biased fault injection that mimics an error caused by a physical circuit event error vulnerability. For example, altering values of bits inside the latch can comprise replicating the physical circuit event error vulnerability.

According to some implementations, the computer-implemented method 800 can include comparing, by the system, a difference between a result of the fault injected into the latch and a defined result without a presence of the fault. Further to these implementations, the computer-implemented method 800 can include determining, by the system, one or more elements of the emulation platform are susceptible to physical circuit event related errors based on a determination that the difference between the result and the defined result is less than a defined difference level.

Figure 9:
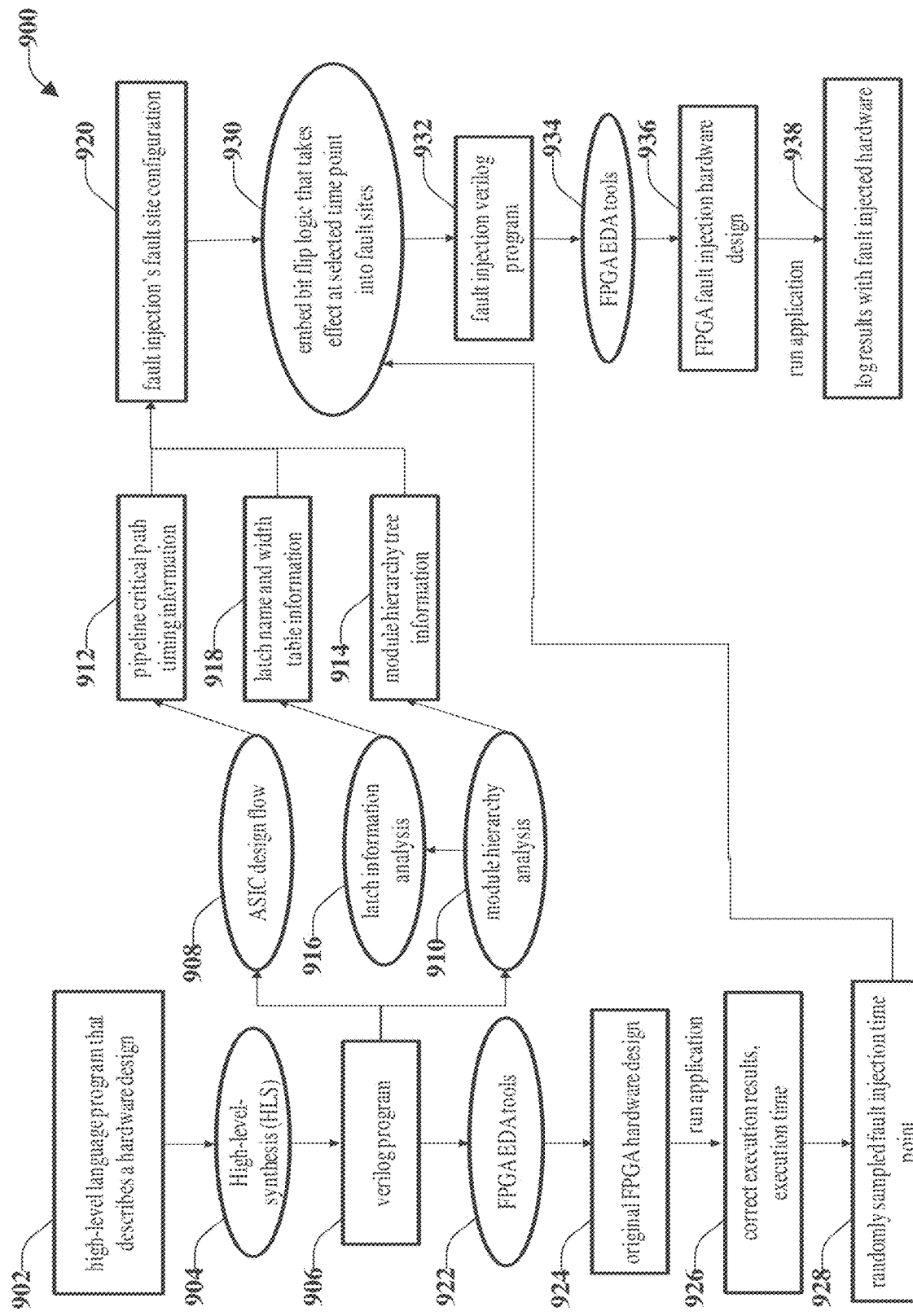
FIG. 9 illustrates a flow diagram of an example, non-limiting computer-implemented method that facilitates injecting faults on high level language generated hardware designs based on pipeline timing margin criticality information in accordance with one or more embodiments described herein.

FIG. 9 illustrates a flow diagram of an example, non-limiting computer-implemented method 900 that facilitates injecting faults on high level language generated hardware designs based on pipeline timing margin criticality information in accordance with one or more embodiments described herein. Repetitive description of like elements employed in other embodiments described herein is omitted for sake of brevity.

The computer-implemented method 900 can start, at 902, with a high-level language program that describes a hardware design. The high-level language program can be a program that describes the hardware design (e.g., the circuit data 114). A high-level synthesis (HLS) can be performed on the high-level language program, at 904, according to some implementations. Based on the HLS, a Verilog program can be formed, at 906.

According to an implementation, after the formation of the Verilog program, an ASIC design flow can be created, at 908, and/or a module hierarchy analysis can be performed, at 910. From the ASIC design flow 908, pipeline critical path timing information 912 can be determined. From the module hierarchy analysis 910, module hierarchy tree information 914 can be determined. Additionally, or alternatively, from the module hierarchy analysis 910, latch information analysis can be performed, at 916. Based on the latch information analysis, latch name and width table information can be determined, at 918. The information obtained at 912, 914, and/or 918, can be input to a fault injection's fault site configuration, at 920. A fault site can be a latch inside a module in the hardware design's Verilog program.

According to another implementation, after the formation of the Verilog program 904, FPGA Electronic Design Automation (EDA) tools 922 can be implemented on an original FPGA hardware design 924. The application can be run (or executed) and execution results can be corrected, at execution time 926. As illustrated at 928, fault injection time points can be randomly sampled.

The respective outputs of 920 and/or 928 can be utilized, at 930, when embedding bit flip logic that can take effect at selected time points into fault sites. A fault injection Verilog program can be run, at 932. FPGA EDA tools can be implemented, at 934 on a FPGA fault injection hardware design 936. The application can be run (or executed) and, at 938, log results with fault injected hardware can be performed.

As discussed, through the ASIC design flow 908, the information related to the pipeline critical path timing information 912 can be determined. Thus, the hardware design can have multiple paths, from a timing point of view. The paths of the multiple paths that are timing critical (or the paths that do not have much slack in terms of timing) are the paths that are vulnerable to the voltage noise or the voltage guard band adjustment.

In further detail, as illustrated in FIG. 9, a hardware design programmed in an HDL can be compiled into an HDL Verilog by a virtual machine, for example. The Verilog can be synthesized into FPGA through corresponding EDA tools. Software applications and application input data can be run on the FPGA hardware. Correct execution results can be stored for future comparison against execution with fault injection (e.g., in the storage 112). End-to-end application run time can be recorded. A random number between zero and total application time can be taken as the time for bit flip fault injection. The random number can be drawn following arbitrary distribution, such as uniform distribution over a range that can be a sub-range between zero and total application time, or a Gaussian distribution.

Further, as illustrated in FIG. 9 the machine-generated Verilog corresponding to the chisel design description can be analyzed its module instantiation hierarchy exposed from the Verilog. For the one or more modules, the system can scan its Verilog code to log latch information, including latch name and width. The one or more latches inside a module (including one or more submodules) can be calculated by recursively accumulating latch information of the submodule(s).

With the design's module hierarchy and latch information, a set of latches to inject fault can be selected. The selected latches can be selected after an ASIC EDA design flow, including physical design. The design flow outputs path timing information extracted from layouts, and can indicate the paths that have long delays. The latches after these latches can be the high priority latches in which to inject bit flip faults. In addition, the power information from ASIC design flow supports temperature analysis, which can further aid timing margin reduction usage from heating.

In addition, as illustrated in FIG. 9, fault injection logic can be embedded into Verilog code. The new Verilog with fault injection logic can be passed onto FPGA EDA tool flow and implemented in FPGA. The application can be run again to record potentially erroneous results under this fault injection setting. The results can be compared against the correct result logged earlier and the impact of stringent timing margin on the set of fault injected latch paths can be evaluated as discussed herein.

The following discusses the analysis to obtain path delay information for a hardware design. The path delay in front of each latch can be extracted from ASIC design flow. The paths that have long outstanding delays, the latches that tend to be located near the chip's temperature hotspot, and/or the latches that are located at a di/dt voltage droop event location can be places where fault injection should be performed. Long path delay can be directly supplied by ASIC design flow. Chip hotspot can be further supplied with a temperature analysis, and di/dt analysis can be performed in a similar manner Other effects, such as transistor aging, can also be optionally added to the process of determining the latches to inject faults. Depending on the fault type (e.g., heating, di/dt, aging, and so on), a different number of latches in the modules can be specified, as well as a different number of bits to flip for the different latches. The pool of candidate latches and modules can be formed via a previous module hierarchy and latch analysis.

Figure 10:
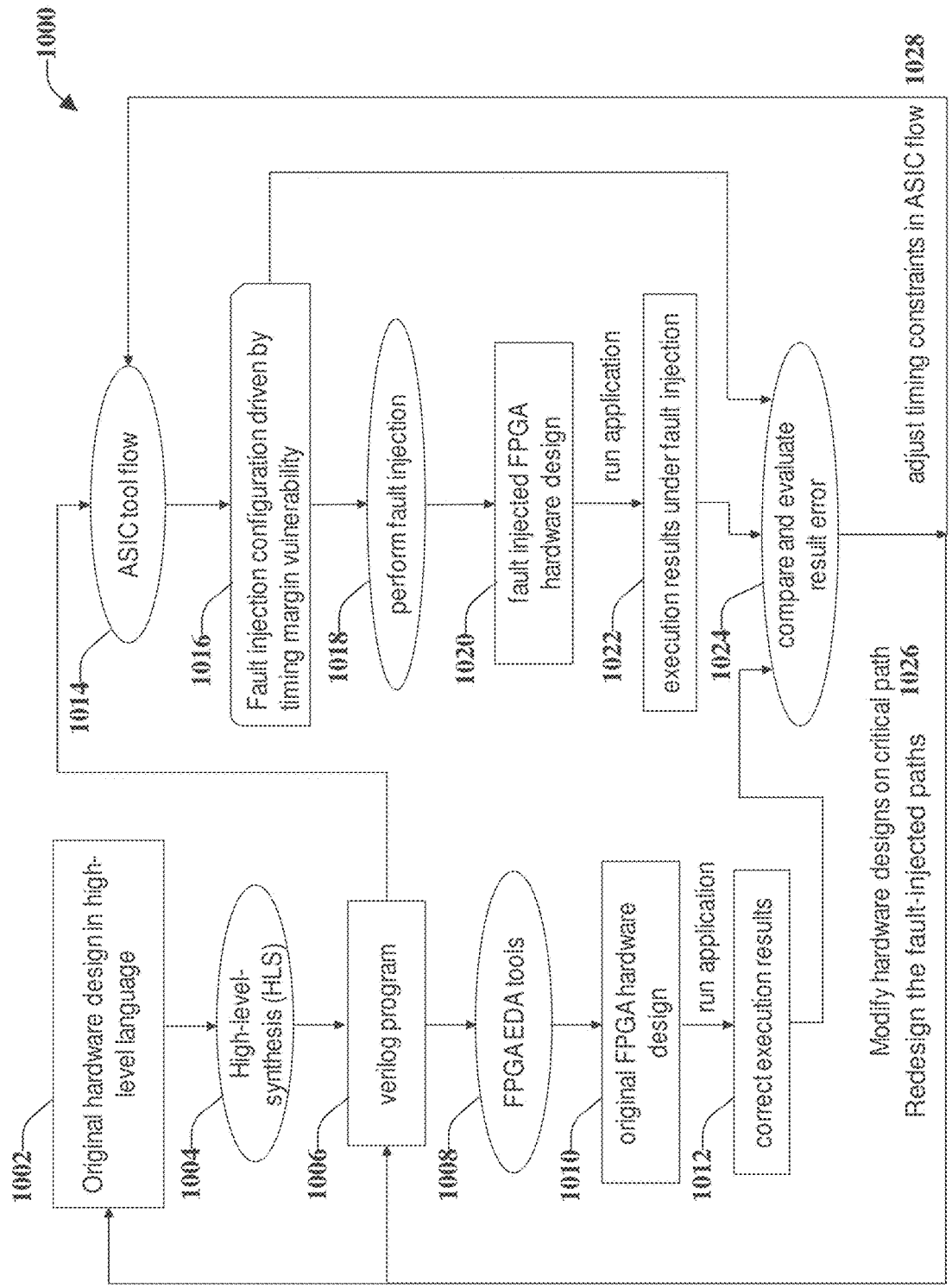
FIG. 10 illustrates a flow diagram of an example, non-limiting computer-implemented method that facilitates determination of a resilient design guided by timing margin driven error emulation in accordance with one or more embodiments described herein.

FIG. 10 illustrates a flow diagram of an example, non-limiting computer-implemented method 1000 that facilitates determination of a resilient design guided by timing margin driven error emulation in accordance with one or more embodiments described herein. Repetitive description of like elements employed in other embodiments described herein is omitted for sake of brevity.

The computer-implemented method 1000 of FIG. 10 can compare the correct execution result from running applications on original correct hardware and the erroneous execution result from running applications on the fault injected hardware. A determination of how tolerant the result is (e.g., application crash, system hang, or erroneous data output) under the corresponding fault configuration can be determined. An option based on the results can be to redesign the fault-injected paths to provide more timing margin, or relax the timing constraints in the ASIC design flow to ensure system resiliency under a set of applications of interest.

According to some implementations, the fault injection configuration can be generated by evaluating the timing, power, and/or temperature information, which can be generated from ASIC design flow. Paths and latches with less timing margin, higher temperature, and so on can receive higher bit flips in the configuration. The configuration can specify the modules, and the latches inside the modules to perform bit flipping error injection.

According to some implementations, for the fault injection modules, the various aspects can embed a cycle counter that can keep track of the time passed. This time can be compared against a defined time point to inject fault. An equal bit flip can be performed. For the fault injection latches in the module, the signals to perform bit flips can be declared for fault injection, including mux select signals for latch original data and faulty data, wires that store faulty data, and an xor gate that implements bit flip. After signal declaration, the actual xor, mux, and comparison logic can be instantiated. Further, the original latch signal can be replaced with the new faulty data when its value is used.

It is noted that a timer or cycle counter is not utilized in accordance with some aspects. Instead, faults can be injected randomly or based on a distribution derived from a physical circuit event.

According to some implementations, to determine the fault injection logic, for the different fault sites, the system can add the cycle counter that tracks time, the xor gate that implements bit flipping, and the multiplexer that selects faulty data. The cycle counter can be added on a per-module basis. A comparator can check if the current cycle is the fault injection time point determined in a previous correct run. If so, the mux can select the bit flipped data generated by an xor gate.

With continuing reference to FIG. 10, illustrated is an example of a resilient design guarded by a timing margin through error emulation. Analysis can be performed to determine the critical paths. Upon or after the determination, information can be fed back to modify the design. For example, the information fed back can relate to re-timing and/or a redesign of one or more paths.

In further detail, at 1002, an original hardware design, which can be in a high-level language, can be defined. The definition can include various information related to the hardware design including, but not limited to, hardware elements, one or more paths associated with the hardware elements, an input voltage level, and so on. A high-level synthesis (HLS) can be performed on the original hardware design, at 1004. A Verilog program can be created at 1006. According to an example, the program can be a Verilog program, a VHDL program, or another RTL type of program.

As illustrated, according to an implementation, FPGA EDA tools can be utilized for the Verilog program, at 1008, resulting in an original FPGA hardware design 1010. The original FPGA hardware design can be run (e.g., run application) and the execution results can be corrected at 1012.

According to another implementation, an ASIC tool flow 1014 can be run on the Verilog program 1006. A fault injection configuration, driven by timing margin vulnerability can be performed at 1016. Thus, fault injection can be performed, at 1018, and a fault injected FPGA hardware design can be determined, at 1020. The application for the fault injected FPGA hardware design can be run and results under fault injection can be executed at 1022.

The respective outputs at 1012, 1016, and/or 1022 can be compared and the result error evaluated, at 1024. Based on the comparison and evaluation, hardware design on a critical path can be modified and/or the fault-injected paths can be redesigned, at 1026. For example, the modification can be performed in Verilog or a high-level language, for example.

According to some implementations, retiming the design can include modifying the RTL/Intermediate Representation (IR), such as with Flexible Intermediate Representation for RTL (FIRRTL)/EDA tools (e.g., retiming options in Cadence), for example. Re-floor planning the design to prioritize the paths suffering from timing errors can be performed according to some implementations. In additional, or alternative implementations, technology-level optimizations, such as use of different Vt transistors (e.g., low Vt transistors specifically for timing vulnerable paths) can be utilized.

The results can be fed back into the original hardware design, at 1002, and/or to the Verilog program, at 1006. According to another implementation, based on the comparison and evaluation, the timing constraints in the ASIC flow can be adjusted, at 1028, and fed back to the ASIC tool flow, at 1014. According to an example, the hardware design on one or more critical paths can be modified. In another example, timing constraints in the ASIC flow can be adjusted. Thus, actions can be taken to reduce or mitigate failure along the paths.

As discussed herein, the various aspects can take a machine-generated HDL from high-level synthesis, and can accumulate all module hierarchy and latch information from the design. Given a set of modules and latches from the accumulated information, bits inside the latches can be randomly flipped. The latches can be guided by path timing information generated from ASIC design flow. Paths with longer delay can be more susceptible to stringent timing margin, and the associated latches can receive more bit flip errors.

The one or more aspects discussed herein can inject fault into latches by embedding a set of combinational logic that selects original authentic latch data, or faulty data with bit flips. The new hardware design with fault injection logic can be synthesized to FPGA to run applications. Applications can be run (or executed) on the fault injected hardware. Execution results can be compared with fault injection, versus correct results, and the timing margin error vulnerability of the injected latches can be evaluated. Modifications to the hardware design, or a re-synthesize design with different timing constraints can be created (or suggested) to enhance resiliency of the hardware design.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 11:
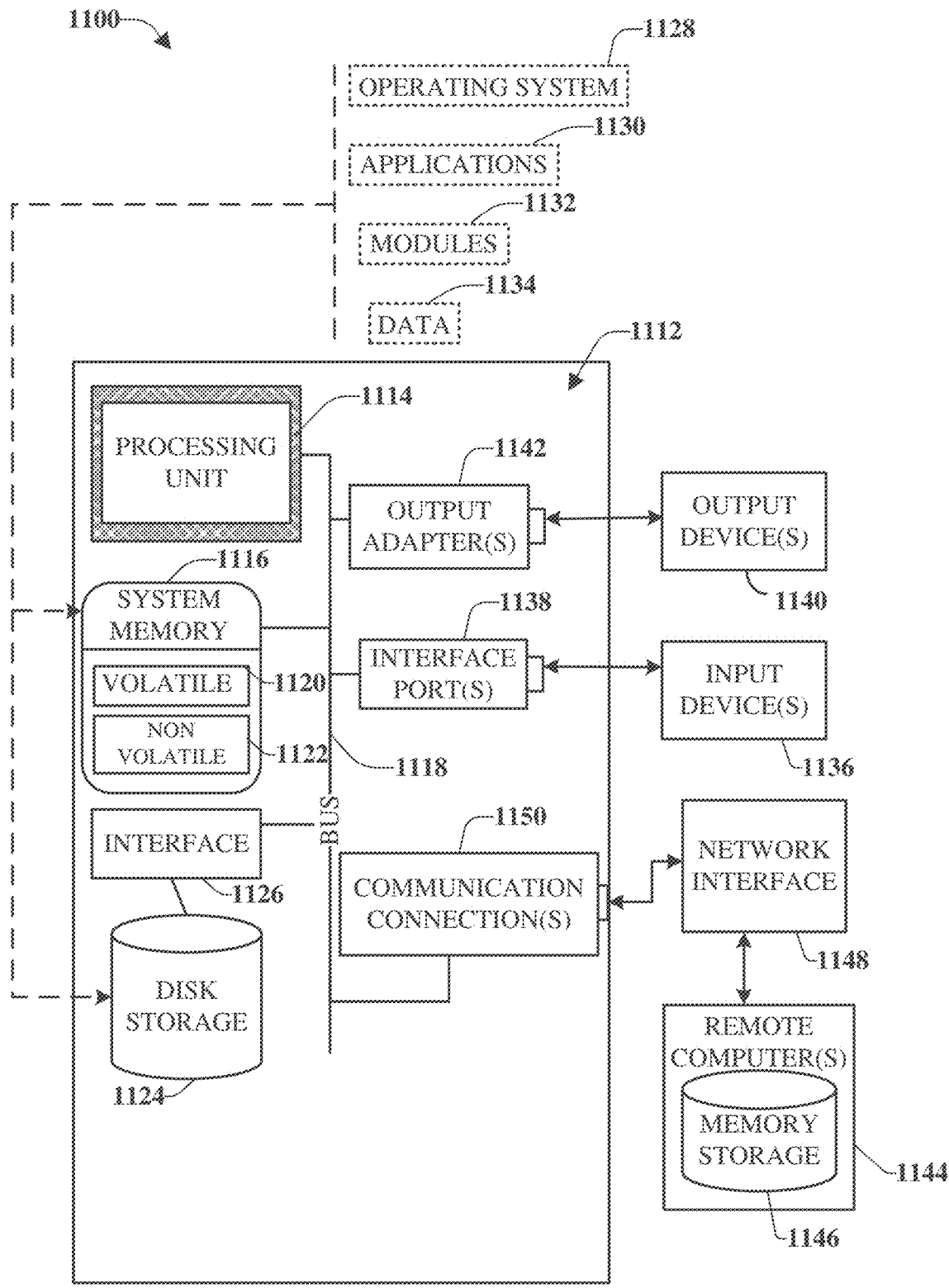
FIG. 11 illustrates a block diagram of an example, non-limiting operating environment in which one or more embodiments described herein can be facilitated.

To provide a context for the various aspects of the disclosed subject matter, FIG. 11 as well as the following discussion are intended to provide a general description of a suitable environment in which the various aspects of the disclosed subject matter can be implemented. FIG. 11 illustrates a block diagram of an example, non-limiting operating environment in which one or more embodiments described herein can be facilitated. Repetitive description of like elements employed in other embodiments described herein is omitted for sake of brevity. With reference to FIG. 11, a suitable operating environment 1100 for implementing various aspects of this disclosure can also include a computer 1112. The computer 1112 can also include a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114. The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 1116 can also include volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 1120 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1112 can also include removable/non-removable, volatile/non-volatile computer storage media. FIG. 11 illustrates, for example, a disk storage 1124. Disk storage 1124 can also include, but is not limited to, devices like a magnetic disk drive, floppy disk drive, tape drive, Jaz drive, Zip drive, LS-100 drive, flash memory card, or memory stick. The disk storage 1124 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1124 to the system bus 1118, a removable or non-removable interface is typically used, such as interface 1126. FIG. 11 also depicts software that acts as an intermediary between users and the basic computer resources described in the suitable operating environment 1100. Such software can also include, for example, an operating system 1128. Operating system 1128, which can be stored on disk storage 1124, acts to control and allocate resources of the computer 1112. System applications 1130 take advantage of the management of resources by operating system 1128 through program modules 1132 and program data 1134, e.g., stored either in system memory 1116 or on disk storage 1124. It is to be appreciated that this disclosure can be implemented with various operating systems or combinations of operating systems. A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port can be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a method of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a computer, a server, a router, a network PC, a workstation, a microprocessor based appliance, a peer device or other common network node and the like, and typically can also include many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1150 refers to the hardware/software employed to connect the network interface 1148 to the system bus 1118. While communication connection 1150 is shown for illustrative clarity inside computer 1112, it can also be external to computer 1112. The hardware/software for connection to the network interface 1148 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
a memory that stores computer executable components; and
a processor that executes the computer executable components stored in the memory, wherein the computer executable components comprise:
an observation component that determines one or more paths of an emulated hardware design that are vulnerable to physical circuit event related errors based on a biased fault injection; and
a feedback component that returns timing error information obtained from the biased fault injection into a synthesis flow that selectively targets vulnerable elements in the emulated hardware design.

2. The system of claim 1, wherein the computer executable components further comprise:
a modification component that selectively adjusts a timing of the one or more paths based on a determination that the one or more paths are vulnerable to the physical circuit event related errors.

3. The system of claim 1, wherein the computer executable components comprise a simulation component that injects a fault into a latch and a combination of logic of the emulated hardware design, wherein the fault is a biased fault injection that mimics an error caused by a physical circuit event error vulnerability, and wherein the simulation component selectively injects the fault into a timing-critical element of the emulated hardware design.

4. The system of claim 3, further comprising:
a selection component that randomly changes bits inside the latch, wherein the changes to the bits mimic the error caused by the physical circuit event error vulnerability.

5. The system of claim 3, further comprising:
a comparison component that evaluates a difference between a result of the fault injected into the latch against a determined acceptable result, wherein the observation component determines the one or more paths are vulnerable to the physical circuit event related errors based on a determination that the difference is below a defined difference level.

6. The system of claim 3, wherein the simulation component injects the fault into the one or more paths, and wherein the observation component determines respective criticalities of the one or more paths based on a defined threshold, and wherein the fault comprises a bit flip error.

7. The system of claim 3, wherein the simulation component embeds combination logic that selects between authentic latch data and faulty latch data.

8. The system of claim 1, further comprising:
a modification component that changes a timing constraint of the emulated hardware design, wherein the timing constraint increases a resiliency of the emulated hardware design.

9. A computer-implemented method, comprising:
injecting, by a system operatively coupled to a processor, a biased fault injection into one or more paths of an emulated hardware design;
determining, by the system, respective criticalities of the one or more paths based on a defined threshold, wherein the biased fault injection comprises a bit flip error; and
determining, by the system, the one or more paths are vulnerable to physical circuit event related errors based on the biased fault injection.

10. The computer-implemented method of claim 9, further comprising:
selectively adjusting, by the system, a timing of the one or more paths based on a determination that the one or more paths are vulnerable to the physical circuit event related errors.

11. The computer-implemented method of claim 9, further comprising:
selectively injecting, by the system, the biased fault injection into a timing-critical element of the emulated hardware design.

12. The computer-implemented method of claim 9, further comprising injecting, by the system, the biased fault injection into a latch and a combination of logic of the emulated hardware design, wherein the biased fault injection mimics an error caused by a physical circuit event error vulnerability; and
randomly changing, by the system, bits inside the latch, wherein the changes to the bits mimic the error caused by the physical circuit event error vulnerability.

13. The computer-implemented method of claim 12, further comprising:
evaluating, by the system, a difference between a result of the biased fault injection injected into the latch against a determined acceptable result; and
determining, by the system, the one or more paths are vulnerable to the physical circuit event related errors based on a determination that the difference is below a defined difference level.

14. The computer-implemented method of claim 9, further comprising:
embedding, by the system, combination logic that selects between authentic latch data and faulty latch data.

15. The computer-implemented method of claim 9, further comprising:
changing, by the system, a timing constraint of the emulated hardware design, wherein the timing constraint increases a resiliency of the emulated hardware design.

16. A non-transitory computer program product that facilitates determination and correction of physical circuit event related errors of a hardware design, the computer program product comprising a computer readable storage medium having program instructions embodied therewith, the program instructions are executable by a processor to cause the processor to:
determine one or more paths of emulated hardware design that are vulnerable to physical circuit event related errors based on a biased fault injection; and
embedding combination logic that selects between authentic latch data and faulty latch data.

17. The non-transitory computer program product of claim 16, wherein the program instructions cause the processor to selectively adjust a timing of the one or more paths based on a determination that the one or more paths are vulnerable to the physical circuit event related errors.

18. The non-transitory computer program product of claim 16, wherein the program instructions cause the processor to change a timing constraint of the hardware design, and wherein the timing constraint increases a resiliency of the hardware design.

19. The non-transitory computer program product of claim 16, wherein the program instructions cause the processor to selectively inject the biased fault injection into a timing-critical element of the emulated hardware design.

20. The non-transitory computer program product of claim 16, wherein the program instructions cause the processor to inject the biased fault injection into one or more paths of an emulated hardware design.

* * * * *